(12) United States Patent
Petrie et al.

(10) Patent No.: US 12,159,667 B2
(45) Date of Patent: Dec. 3, 2024

(54) INTERNAL REFERENCE RESISTOR FOR NON-VOLATILE MEMORY

(71) Applicant: Micron Technology, Inc., Boise, ID (US)

(72) Inventors: Neil Petrie, St. Louis Park, MN (US); Yoav Weinberg, Weinberg (CA)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 17/831,414

(22) Filed: Jun. 2, 2022

(65) Prior Publication Data

US 2023/0395146 A1    Dec. 7, 2023

(51) Int. Cl.
*G11C 13/00* (2006.01)

(52) U.S. Cl.
CPC ........ *G11C 13/004* (2013.01); *G11C 13/0038* (2013.01); *G11C 13/0069* (2013.01); *G11C 2013/0054* (2013.01)

(58) Field of Classification Search
CPC .............. G11C 13/004; G11C 13/0038; G11C 13/0069; G11C 2013/0054

USPC ........................................................ 365/148
See application file for complete search history.

(56) References Cited

U.S. PATENT DOCUMENTS

| | | | |
|---|---|---|---|
| 9,455,013 | B2 | 9/2016 | Kim |
| 10,175,119 | B1 | 1/2019 | Perrott |
| 10,270,441 | B2 | 4/2019 | Nguyen |
| 10,527,651 | B2 | 1/2020 | Wood |
| 10,937,497 | B2 | 3/2021 | Bertin |
| 2019/0348096 | A1* | 11/2019 | Antonyan .......... G11C 13/0026 |

\* cited by examiner

*Primary Examiner* — Huan Hoang
(74) *Attorney, Agent, or Firm* — Brooks, Cameron & Huebsch, PLLC (57) ABSTRACT

An example apparatus include an array of memory cells. The example apparatus includes a memory controller coupled to the array. The memory controller can include an internal reference resistor. The memory controller can be configured to monitor memory characteristics for the array and the memory controller. The memory controller can be configured to trim the internal reference resistor to result in a target resistance value based on the memory characteristics.

20 Claims, 6 Drawing Sheets

INTERNAL REFERENCE RESISTOR FOR NON-VOLATILE MEMORY

TECHNICAL FIELD

Embodiments of the disclosure relate generally to memory sub-systems, and more specifically, relate to an internal reference resistor for non-volatile memory.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to an internal reference resistor for non-volatile memory, in particular to memory sub-systems that include a memory sub-system internal reference resistor for calibration. A memory sub-system can be a storage system, storage device, a memory module, or a combination of such. An example of a memory sub-system is a storage system such as a managed NAND (mNAND) that can include a solid-state drive (SSD), eMMC devices, UFS devices, etc. Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of a non-volatile memory device is a three-dimensional cross-point memory device that includes a cross-point array of non-volatile memory cells. Other examples of non-volatile memory devices are described below in conjunction with FIG. 1. A non-volatile memory device, such as a three-dimensional cross-point memory device, can be a package of one or more memory components (e.g., memory dice). Each die can consist of one or more planes. Planes can be grouped into logic units. For example, a non-volatile memory device can be assembled from multiple memory dice, which can each form a constituent portion of the memory device.

One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area that can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

During operation a memory sub-system can use a reference resistor to calibrate internal signals. In some previous approaches, the reference resistor can be external to the memory sub-system. These previous approaches can require extra pins for communication with the external resistor in addition to additional memory and power costs associated with additional devices within an ASIC package or sub-system board.

Aspects of the present disclosure address the above and other deficiencies by using a reference resistor that can be a resistor internal to a memory controller of the memory sub-system which can reduce costs, reduce area and assembly complexity, and reduce an external package pin count for the memory sub-system (e.g., for an application-specific integrated circuit (ASIC)). Further, the internal reference resistor can allow for adjustment of the reference resistor values based on a supply voltage variation and temperature variation of the memory sub-system. Further, the internal reference resistor can be trimmed to achieve a desired resistance. The trim values can be stored in the memory sub-system to track resistance over varying voltages and temperatures. Furthermore, the internal reference resistor can be designed in sections as part of the memory controller and include switches in the circuit to enable/disable additional resistor sections to achieve a target resistance value. The target switch setting combinations can be stored on the memory controller to eliminate a need to re-calibrate the internal reference resistor every time it is used.

Figure 1:
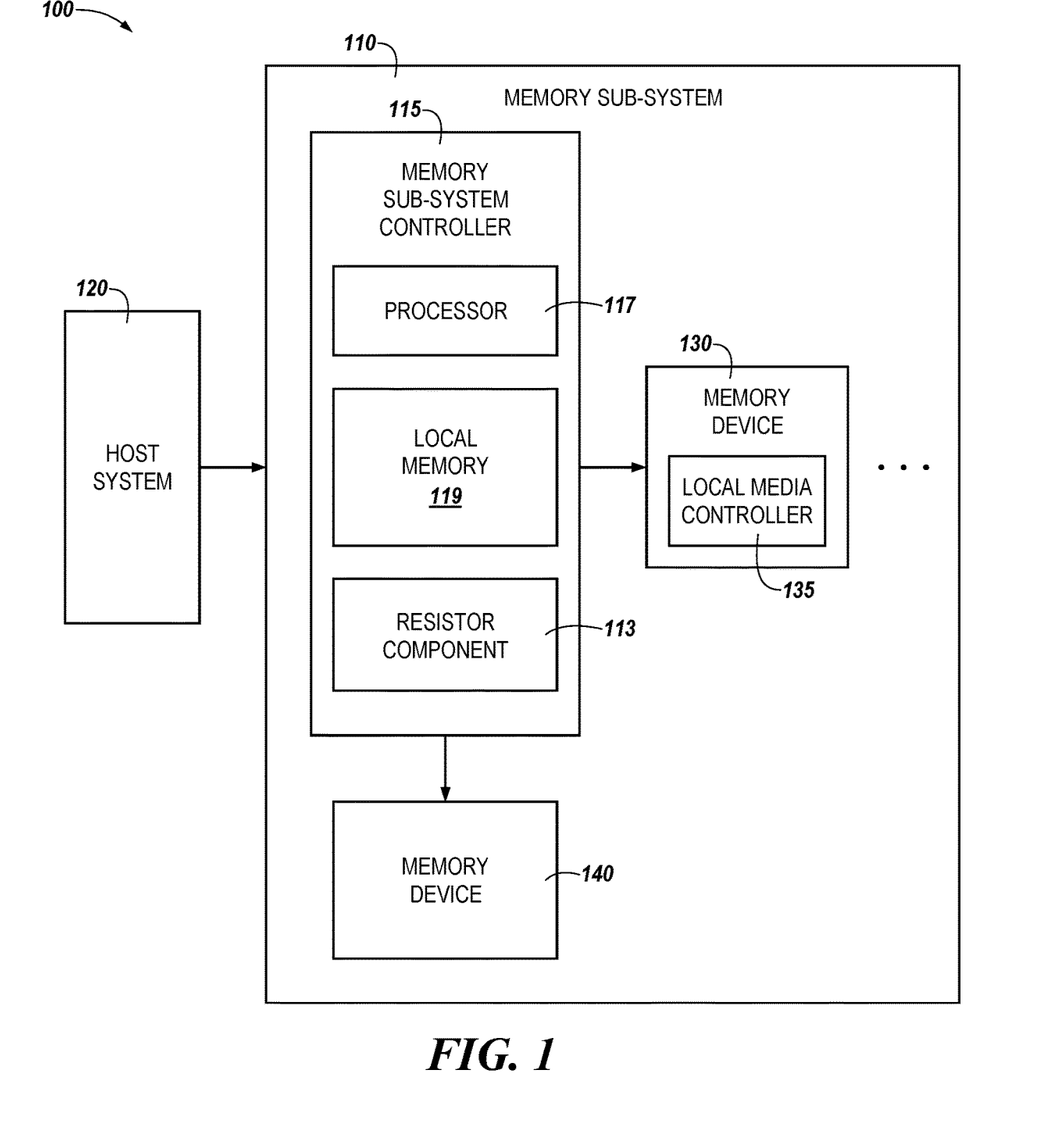
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a resistor component 113. Although not shown in FIG. 1 so as to not obfuscate the drawings, the resistor component 113 can include various circuitry to facilitate calibration of the memory sub-system signals for a memory sub-system and/or components of the memory sub-system. In some embodiments, the resistor component 113 can include special purpose circuitry in the form of an ASIC, FPGA, state machine, and/or other logic circuitry that can allow the resistor component 113 to orchestrate and/or perform operations to selectively perform calibration for the memory device 130 and/or the memory device 140 based on determined voltage and temperature calibration values.

In some embodiments, the memory sub-system controller 115 includes at least a portion of the resistor component 113. For example, the memory sub-system controller 115 can include a processor 117 (processing device) configured to execute instructions stored in local memory 119 for performing the operations described herein. In some embodiments, the resistor component 113 is part of the host system 110, an application, or an operating system.

In a non-limiting example, an apparatus (e.g., the computing system 100) can include a memory sub-system resistor component 113. The memory sub-system resistor component 113 can be resident on the memory sub-system 110. As used herein, the term "resident on" refers to something that is physically located on a particular component. For example, the memory sub-system resistor component 113 being "resident on" the memory sub-system 110 refers to a condition in which the hardware circuitry that comprises the memory sub-system resistor component 113 is physically located on the memory sub-system 110. The term "resident on" can be used interchangeably with other terms such as "deployed on" or "located on," herein. In some embodiments, as will be described below, the memory sub-system resistor component 113 is resident on the memory sub-system controller 115.

The memory sub-system resistor component 113 can be configured to monitor temperature characteristics for memory components of the memory sub-system and determine that a resistor value corresponding to at least one of the memory components should be changed based on the monitored temperature. As described above, the memory components can be memory dice or memory packages that form at least a portion of the memory device 130.

In another non-limiting example, a system (e.g., the computing system 100) can include a memory sub-system 110 comprising memory components arranged to form a stackable cross-gridded array of memory cells. A processing device (e.g., the processor 117 and/or the local media controller 135) can be coupled to the memory components and can perform operations comprising adjusting an internal reference resistor component 113 based on voltage and/or temperature characteristics for the memory components and determining that a temperature and/or voltage characteristic corresponding to at least one of the memory components has reached a threshold such that the internal reference resistor component 113 should be adjusted.

The internal reference resistor component 113 can be used for biasing and calibration of the Rx and Tx terminations. Each physical layer (e.g., "PHY") may need access to a reference resistor. This access can be for each physical layer or it may be shared. In the same way, each non-volatile memory device (e.g., each NAND) may need to be connected to a reference resistor. The internal reference resistor component 113 can be used for both the physical layer(s) and the non-volatile memory device(s).

Figure 2:
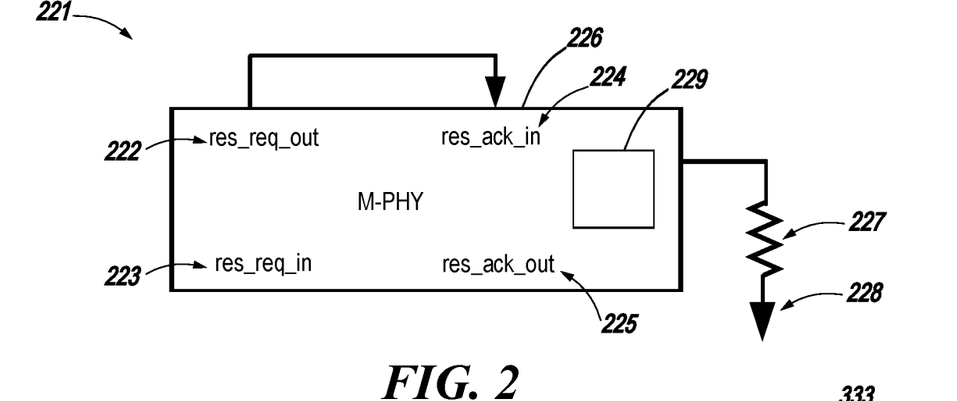
FIG. 2 is an example diagram for an internal reference resistor connected to a physical layer in accordance with some embodiments of the present disclosure.

FIG. 2 is an example diagram 221 for an internal reference resistor connected to a physical layer in accordance with some embodiments of the present disclosure. An example physical layer can include an M-PHY. An M-PHY is a high speed communications physical layer protocol. M-PHY can be used for a number of specifications, including Mobile PCI Express, Universal Flash Storage, and, in some examples, as the physical layer for SuperSpeed Inter-Chip USB. To support high speed, M-PHY is generally transmitted using differential signaling over impedance controlled traces between components. When used on a single circuit card, the use of electrical termination may be optional. Options to extend its range can include operation over a short flexible flat cable, and M-PHY was designed to support optical medica converters allowing for extended distance between transmitters and receivers, and reducing concerns with electromagnetic interference.

The M-PHY 226 of the example diagram 221 can use a 200Ω±1% 100-ppm/degrees Celsius reference resistor (e.g., internal reference resistor as used herein) to ground 228. The internal reference resistor can be automatically used for calibration when the physical layer comes out of reset, and when a manual tuning request is received. What a physical layer is using the internal reference resistor, it can force current across the resistor. When a physical layer is not using the internal reference resistor, the current can be disabled. In some examples, the maximum current through the internal reference resistor is 2 milliAmps (mA).

The example diagram 221 includes a number of inputs and outputs to the physical layer 226. For example, the physical layer 226 includes a resistor request input ("res_req_in") 223 and a resistor acknowledgement input ("res_ack_in") 224. The physical layer 226 includes a resistor request output ("res_req_out") 222 and a resistor acknowledgement output ("res_ack_out") 225. The resistor request output 222 from the physical layer 226 can be returned as a resistor acknowledgment input 224 once the requested action in the resistor request output 222 has been performed.

The physical layer 226 includes an internal reference resistor (e.g., an internal reference resistor) 229 that is used for calibration and operation without accessing a resistor external to the physical layer 226. In some embodiments prior to use of the physical layer 226 in the field, an external resistor 227 can be used for initial calibration of the internal reference resistor 229 in order to properly setup the internal reference resistor 229 for use without the external resistor 227. As an example, the memory sub-system including the physical layer 226 can be tested under a plurality of temperatures in order to determine the behavior of the external resistor 227 and the internal reference resistor 229 in order to calibrate the behavior of the internal reference resistor 229 during future use without referencing the external resistor 227. In some examples, the external resistor 227 can be a 200Ω resistor.

Figure 3:
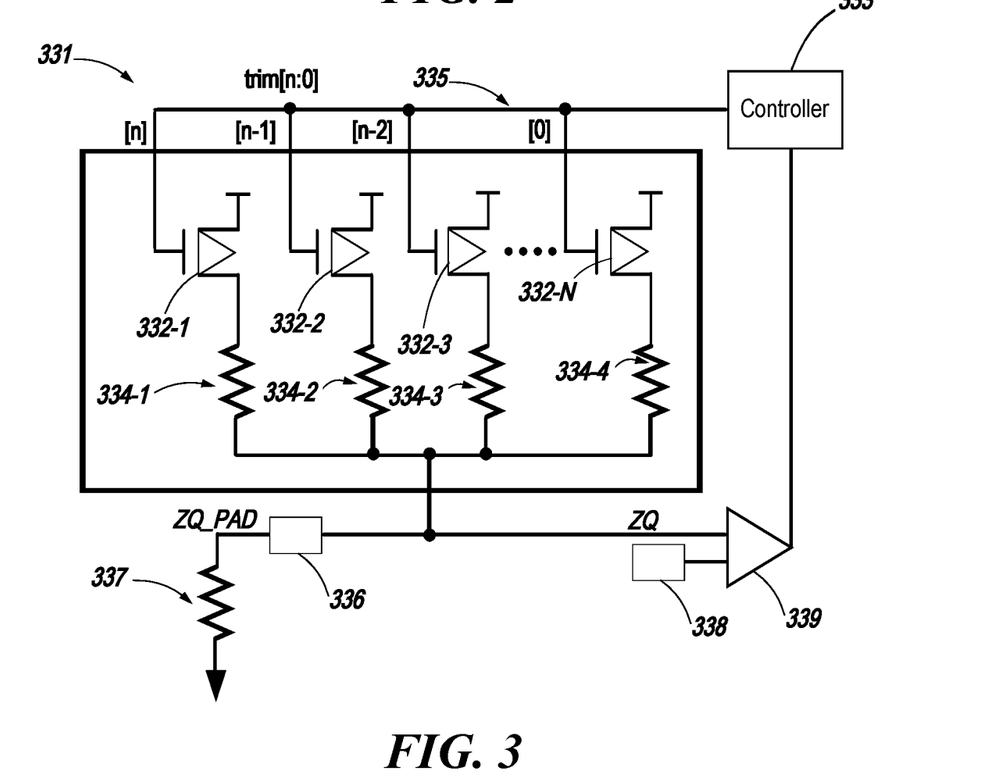
FIG. 3 is an example circuit for an internal reference resistor connected to a non-volatile memory in accordance with some embodiments of the present disclosure.

FIG. 3 is an example diagram 331 for an internal reference resistor connected to a non-volatile memory in accordance with some embodiments of the present disclosure. The example diagram 331 includes a plurality of transistors 332-1, 332-2, 332-3, . . . , 332-N (hereinafter referred to collectively as plurality of transistors 332). A first transistor 332-1 and a second transistor 332-2 are coupled to internal reference resistors 334-1, 334-2 and a third transistor 332-3 and a fourth transistor 332-4 are coupled to internal resistors 334-3, 334-4. The first 334-1, second 334-2, third 334-3, and fourth 334-4 transistors are coupled to controller 333 and external resistor 337. Each of the plurality of transistors 332 can be associated with a corresponding connection. For example, transistor 332-1 can be associated with a first connection ("[n]"), transistor 332-2 can be associated with a second connection ("[n−1]"), transistor 332-3 can be associated with a third connection ("[n−2]"), and transistor 332-N can be associated with a fourth connection ("[0]"). The connections ([n] to [0]) can be associated with trim bits (e.g., "trim[n:0]") that are provided by the controller 333 to control the plurality of corresponding transistors 332. A ZQ_PAD 336 can be between the external resistor 337 and a comparator 339 and between the external resistor 337 and the internal reference resistors 334-1, 334-2. A reference level 338 can be used to set a level for calibration of the internal reference resistors 334-1, 334-2. A particular point 335 of the circuit can be scanned to determine an adequate trim value for calibration.

The internal reference resistor of diagram 331 can be used by a non-volatile memory device (e.g., a NAND memory device). The non-volatile memory device can include a programmable on-die termination (ODT), which can be calibrated using a ZQ calibration block (e.g., the ZQ_PAD 336 above). ZQ calibration is a process that tunes a memory device (e.g., DRAM) input/output (I/O) pad output drivers (drive strength) and ODT values across changes in process, voltage, and temperatures. As illustrated in FIG. 3, the ZQ block requires a 300Ω±1%/degrees Celsius reference resistor to ground. This reference resistor can be shared between 8 or 16 non-volatile dies, however, embodiments are not so limited. When ZQ calibration is enable, the current through the reference resistor is determined by the supply voltage and the total resistance to ground, which in turn depends on the selected non-volatile memory device's ODT. The nominal value for the non-volatile memory device's ODT is 300Ω.

The ZQ calibration can be performed in three stages. First, the internal reference resistor value is compared to an external reference. Second, the P-side ODT can be calibrated by sweeping the trim[n:0] bits. Finally, the N-side ODT can be calibrated. When ZQ calibration is disabled, there may be a small leakage, depending on the ZQ_PAD's 336 voltage.

Figure 4A:
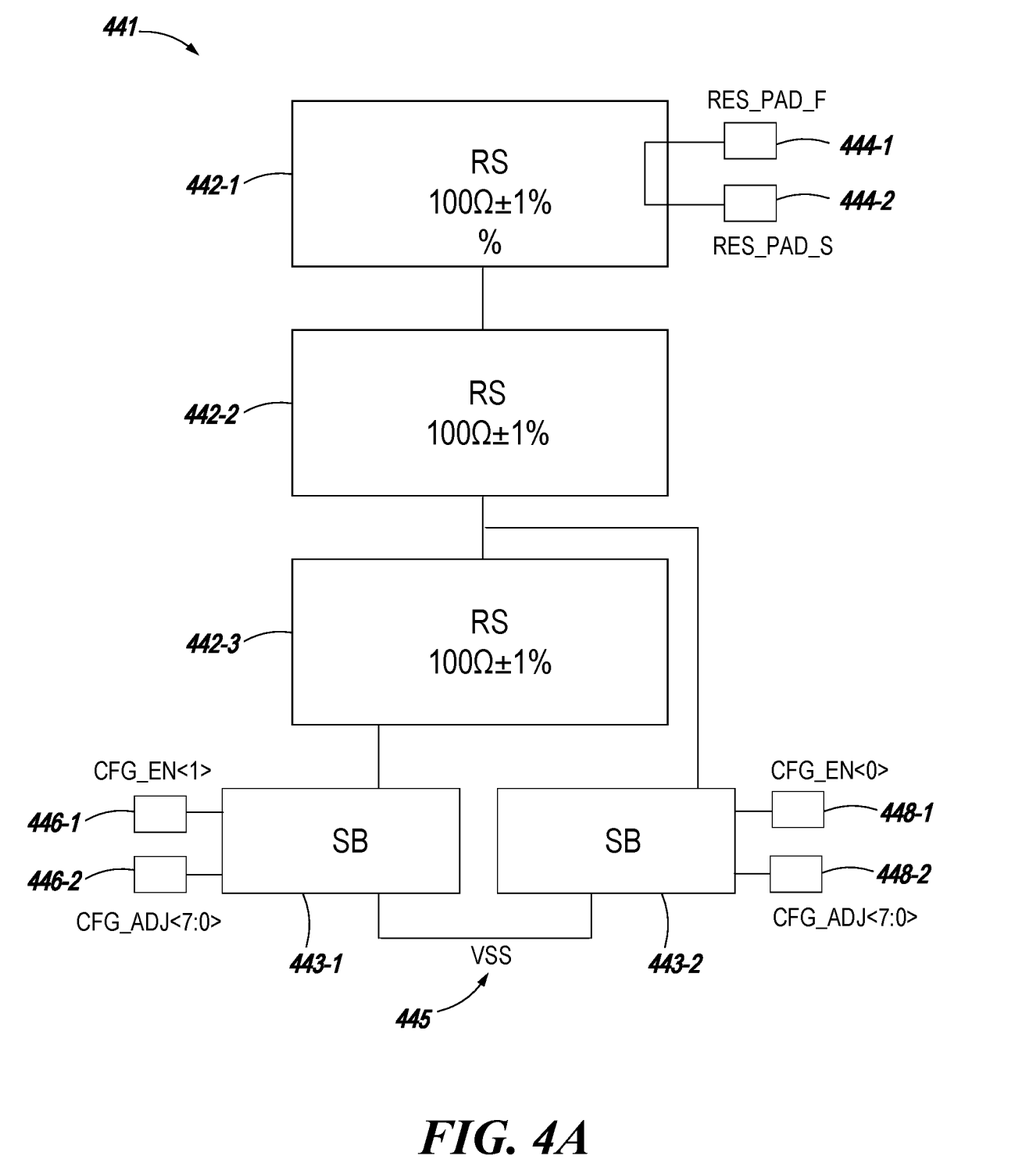
FIG. 4A is an example circuit with resistor segments associated with an internal reference resistor for non-volatile memory in accordance with some embodiments of the present disclosure.

FIG. 4A is an example block diagram 441 of a circuit with resistor segments 442-1, 442-2, 442-3 associated with an internal reference resistor for non-volatile memory in accordance with some embodiments of the present disclosure. The block diagram 441 includes 3 resistor segments 442-1, 442-2, 442-3. As an example, each of the resistor segments 442-1, 442-2, 442-3 can have 100Ω±1% adjustable resistance. The resistor segments 442-1, 442-2, 442-3 can include two switch banks ("SB") 443-1, 443-2 to enable 200-Ω and 300-Ω options. To avoid overvoltage on the switches during power-on, one resistor branch can be connected to ground (without a switch). A first resistor segment 442-1 can be coupled to a first resistor pad ("RES_PAD_F") 444-1 and a second resistor pad ("RES_PAD_S") 444-2. The first resistor pad ("RES_PAD_F") 444-1 can be used to inject a current into a resistor (e.g., resistor 479-1 and/or any of the additional resistors 479-2, 479-3, 479-4, respectively) and the voltage across the resistor generated by that current can be measured at the second resistor pad ("RES PADS") 444-2. In some examples, the first resistor pad 444-1 and/or the second resistor pad 444-2 can be used as wafer probe pads. In some examples, the first resistor pad 444-1 and/or the second resistor pad 444-2 can be connected in a package.

A first switch bank 443-1 can receive inputs from a first configuration enable bit(s) (("CFG_EN<1>") 446-1 and from a first set of configuration adjustment bits ("CFG_ADJ<7:0>") 446-2. The first switch bank 443-1 can be coupled to a reference voltage ("VSS") 445. A second switch bank 443-2 can receive inputs from a second configuration enable bit(s) (CFG_EN<0>") 448-1 and from a second set of configuration adjustment bits ("CFG_ADJ<7: 0>") 448-2. The second switch bank 443-2 can be coupled to the reference voltage ("VSS") 445. In this example, the configurable elements are the first 443-1 and second 443-2 switch banks that can be enabled (or disabled) by the configuration enable bits 446-1, 448-1, respectively, which can be stored in a register in the memory. These configuration enable bits 446-1, 448-1 and configuration adjustment bits 446-2, 448-2 can be stored in memory, effuses, or can be loaded by a processor each time the resistor is to be used in its "trimmed" state. The switch banks 443-1, 443-2 can be "enabled" when not powered down by the configuration enable bits 446-1, 448-1 and the expected resistor values can be controlled by the configuration adjustment bits 446-2, 448-2. During the trimming process, the switch banks 443-1, 443-2 can be enabled and the values adjusted with the configuration adjustment bits 446-2, 448-2 until the correct, trimmed value is achieved.

The 200-Ω and 300-Ω options can be configured at temperatures ranging from −40 degrees Celsius to 125 degrees Celsius. The internal reference resistor can be calibrated across two temperature points, so that it can be adjusted as the temperature changes. One of the branches of the resistor is directly connected to ground, to make sure that the voltage on the PAD does not exceed the voltage limit of the switches. When "disabled," the resistor value is equal to the resistance to the fixed resistor branch, i.e., 370Ω.

The following is a table (Table 1) for describing the labels in FIG. 4A:

TABLE 1

| PIN | TYPE | DESCRIPTION |
|---|---|---|
| RES_PAD F | Input/Output | I/O PAD (Force) |
| RES_PAD S | Input/Output | I/O PAD (Sense) |
| CFG_ADJ<7:0> | Input | Resistance adjust: code [0 . . . 0] results in max resistance |
| CFG_EN<1:0> | Input | Enable 200-22/300-22 resistor |
| VDD | Supply | Core supply |
| VSSA | Supply | Ground |

The following is a table (Table 2) for indicating enable bits and their operation modes.

| | CFG_EN<1:0> | CFG_ADJ<7:0> |
|---|---|---|
| Resistor disabled | 00 | X |
| 200-Ω (M-PHY) | 01 | 0x00: Max R 0xFF: Min R |
| 200-Ω (NAND) | 10 | 0x00: Max R 0xFF: Min R |
| Do not use | 11 | X |
| Ground the PAD when ZQ is disabled | 01 or 10 | 0x00 |

Figure 4B:
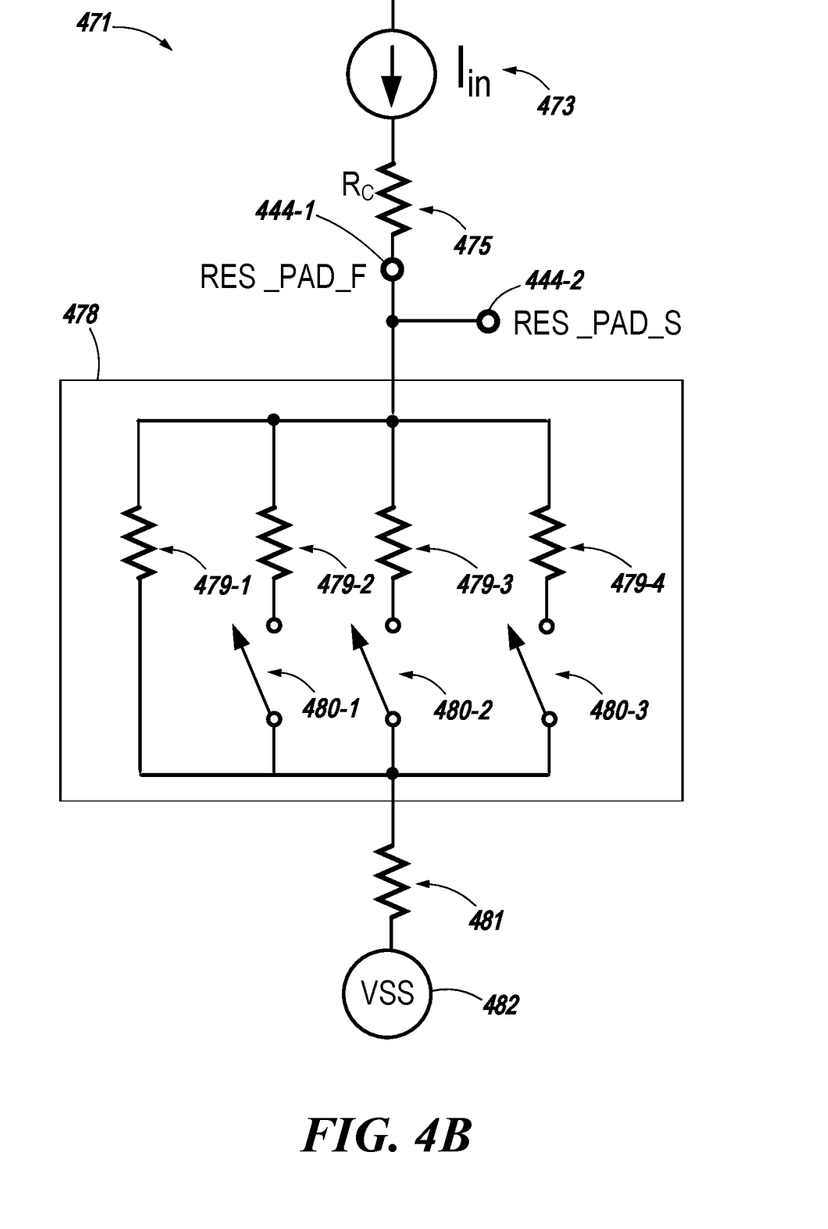
FIG. 4B is an example circuit for a trim code calculation associated with an internal reference resistor for non-volatile memory in accordance with some embodiments of the present disclosure.

FIG. 4B is an example circuit 471 for a trim code calculation associated with an internal reference resistor for non-volatile memory in accordance with some embodiments of the present disclosure. The circuit 471 can include a number of resistors 479-1, 479-1, 479-3, 479-4 (hereinafter referred to collectively as number of resistors 479), a resistor 481, and ($R_c$) 475, a number of switches 480-1, 480-2, 480-3, a VSS connection 482, a current ($I_{in}$) 473, a RES_PAD_F 444-1, and a RES_PAD_S 444-2. The current 473 is injected through the first resistor pad ("RES_PAD_F") 444-1 and a voltage measured at the second resistor pad ("RES_PAD_S") 444-2. Switches 480-1, 480-2, 480-3, etc. (as any number of additional switches may be used, even though three additional are illustrated here), can be used to adjust the resistance between the second resistor pad ("RES_PAD_S") 444-2 and VSS 482 to the target value by including additional resistors 479-2, 479-3, etc., into the current path. The number of resistors 479 and the number of switches 480 can be referred to as a refresh circuit 478.

Using this circuit 471, the internal reference resistor can be calibrated as will be described below. During initial testing, the internal reference resistor can be calibrated using 2 temperature points. As an example, one at 25 degrees Celsius and one at 85 degrees Celsius. At each temperature, the adjust code, CFG_ADJ<7:0>, that provides the most accuracy can be stored as bits in memory cells of a memory array. The temperature coefficient can then be calculated from these measurements. To ensure that the temperature coefficient is calculated with enough precision to allow for less than 100 ppm/degrees Celsius (C) across temperature, high measurement accuracy may be required at 25 degrees Celsius and 85 degrees Celsius, in this example. The precision (step size) of the internal reference resistor may be approximately ±0.5Ω. However, if CFG_ADJ<7:0> is selected such that the error at 85 degrees C. is 0.5Ω and −0.5Ω at 25 degrees C., the aggregated error might exceed ±1% at the ends of the temperature range. To avoid this, two additional bits may be allocated for each measurement, which can allow for calibrating the quantization error.

Calibrations can be done separately for the 200Ω and 300Ω cases. Therefore, 40 bits (2×2×10=40) may be used. In the final implementation, the temperature can vary from −40 deg. C. to 125 deg. C., resulting in a change in the internal reference resistor value. In this case, the controller can use the stored values at 25° C. and 85° C. to calculate the temperature coefficient and adjust the CFG_ADJ<7:0> setting to bring the resistance back to 200Ω±1% or 300Ω±1%.

Further, resistor measurements can be performed by forcing a current through the first resistor pad ("RES_PAD_F") 444-1, and sensing the resulting voltage on the second resistor pad "(RES_PAD_S") 444-2, a configuration known as 'Kelvin Connection.' To accomplish this, direct access to the first and second resistor pads "(RES_PAD_F/S") 444-1, 444-2 may be required. Kelvin sensing eliminates the impact of the probe's contact resistance ($R_c$) by looking at the voltage at the location of the internal reference resistor, rather than at the current injection point.

Figure 5:
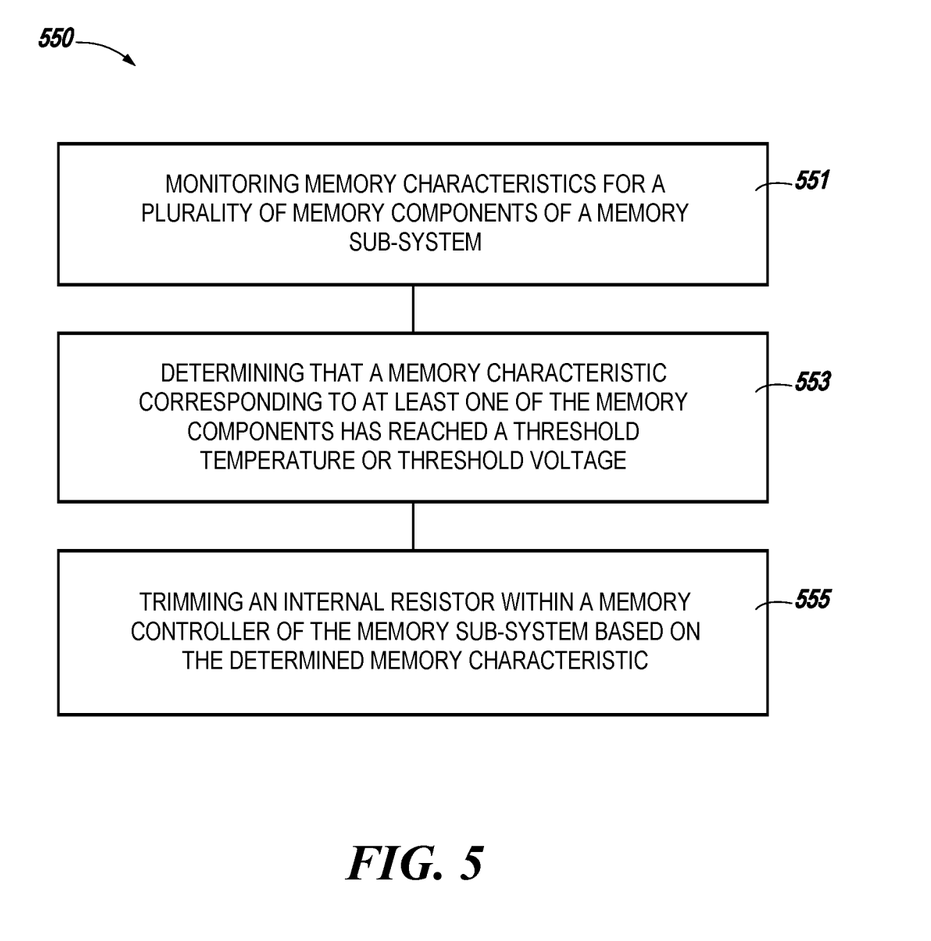
FIG. 5 is a flow diagram corresponding to a method for an internal reference resistor in accordance with some embodiments of the present disclosure.

FIG. 5 is flow diagram corresponding to a method 550 for use of an internal reference resistor for a non-volatile memory in accordance with some embodiments of the present disclosure. The method 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 550 is performed by the resistor component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 551, memory characteristics can be monitored for a plurality of memory components of a memory sub-system. The memory characteristics can include a temperature, a temperature range, a particular voltage, etc. In some examples, the memory characteristic is one of a temperature of at least one of the plurality of memory components or a voltage of at least one of the plurality of memory components. In some embodiments, the memory sub-system can be analogous to the memory sub-system 110 illustrated in FIG. 1. As described above, the memory components can be memory dice or memory packages that are coupled to one another to create an array of memory cells, such as a three-dimensional stackable cross-gridded array of memory cells used by the memory sub-system to store data.

At operation 553, a memory characteristic corresponding to at least one of the memory components has reached a threshold temperature or threshold voltage can be determined. The threshold temperature can be a predetermined threshold temperature determined during a calibration phase. The threshold temperature can be used to enable or disable a number of resistor sections, as described above, in order to reach a target resistance value. At operation 555, an internal reference resistor within a memory controller of the memory sub-system can be trimmed based on the determined memory characteristics.

In some embodiments, the method 550 can further include storing a trim value of the internal reference resistor associated with the determined memory characteristic. The method 550 can further include prior to trimming the internal reference resistor, accessing data comprising temperature value data and voltage data. Subsequent to accessing the data and prior to trimming the internal reference resistor, a trim value can be determined for the internal reference resistor based on at least one of the temperature value data and the voltage data. In some embodiments, the method 550 can further include enabling or disabling at least one internal reference resistor section in response to trimming the internal reference resistor. Further, the method 550 can include enabling or disabling the at least one internal reference resistor section by using a switch within the internal reference resistor. Furthermore, the method 550 can include retrimming the internal reference resistor based on a change in the memory characteristics.

Figure 6:
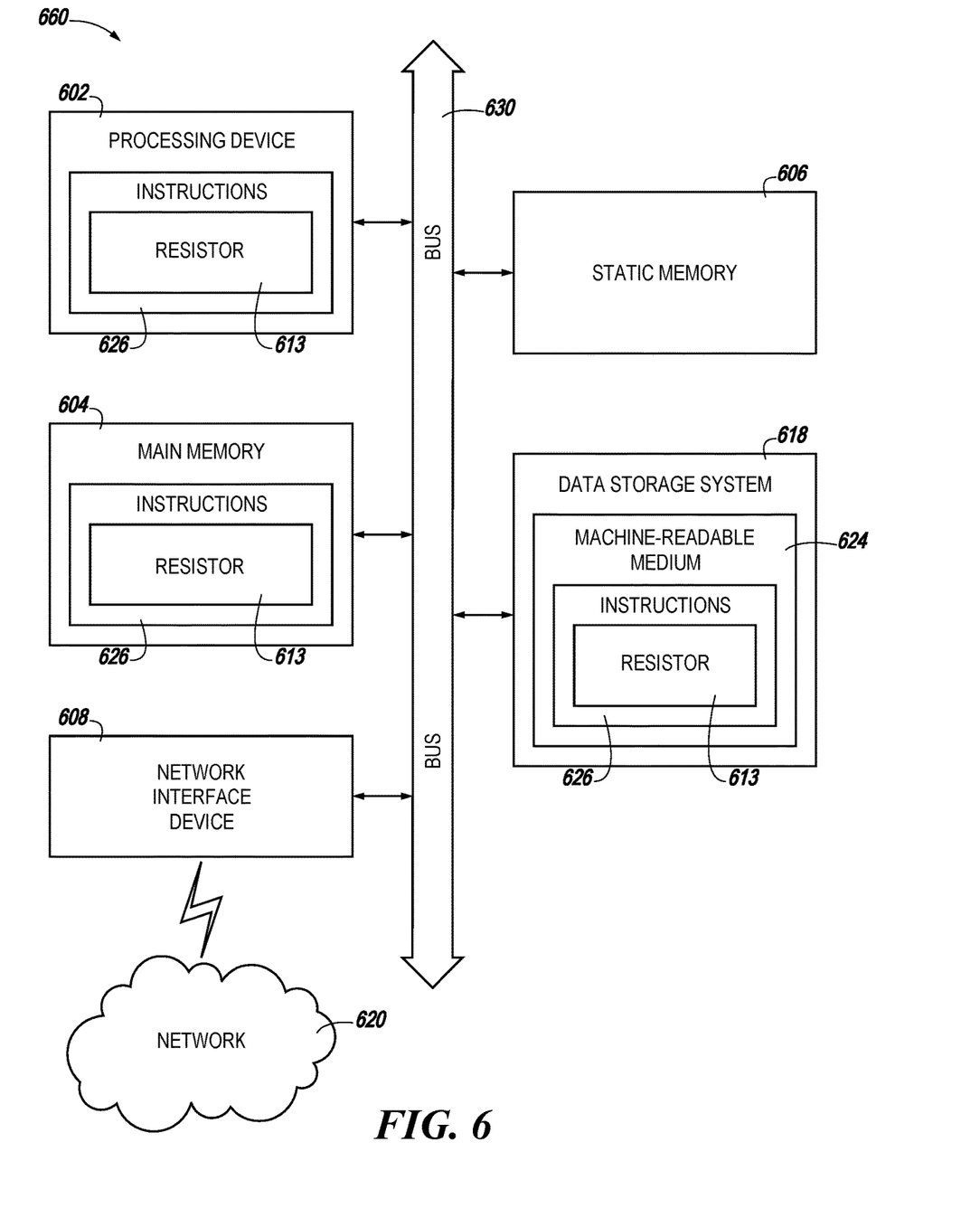
FIG. 6 is a block diagram of an example computer system in which embodiments of the present disclosure may operate.

FIG. 6 is a block diagram of an example computer system 660 in which embodiments of the present disclosure may operate. For example, FIG. 6 illustrates an example machine of a computer system 660 within which a set of instructions, for causing the machine to perform any one or more of the methodologies discussed herein, can be executed. In some embodiments, the computer system 660 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the resistor component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 660 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 660 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 660, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a resistor component (e.g., the resistor component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device, comprising:
   an array of memory cells; and
   a memory controller coupled to the array and comprising an internal reference resistor component used for calibration, wherein the memory controller is configured to:
      monitor memory characteristics for the array and the memory controller; and
      trim the internal reference resistor component to result in a target resistance value based on the memory characteristics.

2. The memory device of claim 1, wherein the memory characteristics comprise at least one of a temperature of the array, a temperature of the memory controller, or a voltage of the array.

3. The memory device of claim 1, wherein the memory controller is configured to store a plurality of internal reference resistor values associated with the memory characteristics.

4. The memory device of claim 1, wherein the internal reference resistor component comprises a plurality of internal reference resistor sections.

5. The method device of claim 4, wherein the internal reference resistor component comprises at least one switch to enable or disable at least one of the internal reference resistor sections.

6. The memory device of claim 4, wherein the memory controller is configured to enable or disable at least one of the internal reference resistor sections to move a resistor value to a target resistance value.

7. The memory device of claim 6, wherein the memory controller is configured to store a plurality of switch combinations that correlate with a resistor value of the internal reference resistor component that corresponds to the monitored memory characteristics.

8. The memory device of claim 1, wherein the memory controller is configured to adjust the trim of the internal reference resistor component in response to a change in the memory characteristics.

9. A method, comprising:
   monitoring memory characteristics for a plurality of memory components of a memory sub-system;
   determining that a memory characteristic corresponding to at least one of the memory components has reached a threshold temperature or threshold voltage; and
   trimming an internal reference resistor component within a memory controller of the memory sub-system based on determining that the memory characteristic has reached the threshold temperature or threshold voltage, wherein the internal reference resistor component is used for calibration.

10. The method of claim 9, wherein the memory characteristic is one of a temperature of at least one of the plurality of memory components or a voltage of at least one of the plurality of memory components.

11. The method of claim 9, further comprising storing a trim value of the internal reference resistor component associated with the determined memory characteristic.

12. The method of claim 9, further comprising, prior to trimming the internal reference resistor component, accessing data comprising temperature value data and voltage data.

13. The method of claim 12, further comprising, subsequent to accessing the data and prior to trimming the internal reference resistor component, determining a trim value for the internal reference resistor component based on at least one of the temperature value data and the voltage data.

14. The method of claim 9, further comprising trimming the internal reference resistor component by enabling or disabling at least one internal reference resistor section.

15. The method of claim 14, further comprising enabling or disabling the at least one internal reference resistor section by using a switch within the internal reference resistor component.

16. The method of claim 9, further comprising retrimming the internal reference resistor component based on a change in the memory characteristics.

17. A system, comprising:
 a plurality of non-volatile memory components;
 an internal reference resistor component; and
 a processing device coupled to the plurality of non-volatile memory components and to an internal reference resistor component, the processing device to perform operations comprising:
  monitoring a temperature value and a voltage value for each of the plurality of non-volatile memory components;
  determining that at least one of the temperature values or the voltage values corresponding to at least one of the plurality of non-volatile memory components has reached a threshold temperature value or threshold voltage value;
  accessing data indicating a resistor configuration for the internal reference resistor component based on corresponding temperature values or corresponding voltage values associated with the plurality of non-volatile memory components; and
  trimming the internal reference resistor component within the processing device based on the determination.

18. The system of claim 17, wherein the plurality of non-volatile memory components comprise a plurality of NAND memory dies.

19. The system of claim 17, wherein the processing device is to perform operations comprising using a first resistance value in response to providing a resistance reference for a physical layer associated with the system and using a second resistance value in response to providing a resistance reference for the plurality of non-volatile memory components.

20. The system of claim 19, wherein the first resistance value is 200 Ohms and the second resistance value is 300 Ohms.

* * * * *